United States Patent
So et al.

(10) Patent No.: US 9,951,999 B2
(45) Date of Patent: Apr. 24, 2018

(54) COOLING DEVICE AND ELECTRONIC EQUIPMENT

(71) Applicant: FUJITSU LIMITED, Kawasaki-shi, Kanagawa (JP)

(72) Inventors: Tsuyoshi So, Kawasaki (JP); Hideo Kubo, Kawasaki (JP); Osamu Aizawa, Kasiwa (JP); Nobuyuki Hayashi, Yokohama (JP); Teru Nakanishi, Isehara (JP); Yoshinori Uzuka, Kawasaki (JP); Nobumitsu Aoki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 80 days.

(21) Appl. No.: 14/571,951

(22) Filed: Dec. 16, 2014

(65) Prior Publication Data

US 2015/0184949 A1    Jul. 2, 2015

(30) Foreign Application Priority Data

Dec. 27, 2013 (JP) ................. 2013-272813
Dec. 1, 2014 (JP) ................. 2014-243454

(51) Int. Cl.
*H01L 23/427* (2006.01)
*H05K 7/20* (2006.01)
*F28D 15/02* (2006.01)

(52) U.S. Cl.
CPC ....... *F28D 15/025* (2013.01); *F28D 15/0266* (2013.01); *H01L 23/427* (2013.01); *H05K 7/20809* (2013.01); *H01L 2924/0002* (2013.01)

(58) Field of Classification Search
CPC ................. H01L 23/427; H01L 23/473; H01L 31/0521; H01L 2924/0002; H01L 2924/00; G06F 2200/201; G06F 1/206; H05K 7/20809; H05K 7/20836; H05K 7/20827; H05K 7/20336; H05K 7/20318; H05K 7/20818; H05K 7/20381; F28F 3/12; F28D 15/025; F28D 15/0266
See application file for complete search history.

(56) References Cited

U.S. PATENT DOCUMENTS

| | | | | |
|---|---|---|---|---|
| 5,802,859 A | * | 9/1998 | Zugibe | F25B 45/00 62/125 |
| 6,141,977 A | * | 11/2000 | Zugibe | F25B 45/00 62/125 |
| 2004/0070949 A1 | * | 4/2004 | Oikawa | F28D 15/0266 361/718 |

(Continued)

FOREIGN PATENT DOCUMENTS

| JP | 06-224337 A | 8/1994 |
|---|---|---|
| JP | 10-209356 A | 8/1998 |
| JP | 2003-318342 A | 11/2003 |

*Primary Examiner* — Adam B Dravininkas
(74) *Attorney, Agent, or Firm* — Squire Patton Boggs (US) LLP

(57) ABSTRACT

A cooling device includes: a refrigerant circulation loop configured to depressurizing the inside thereof, the refrigerant circulation loop includes, an evaporator that vaporizes a part of refrigerant by heat generated by an electronic component, a condenser that cools the refrigerant, and a pump that circulates the refrigerant, wherein a filling ratio of liquid refrigerant to a volume of the refrigerant circulation loop is configured to maintain a refrigerant circulation capability of the pump.

9 Claims, 6 Drawing Sheets

(56) References Cited

U.S. PATENT DOCUMENTS

| | | | |
|---|---|---|---|
| 2005/0178529 A1* | 8/2005 | Suzuki | F28D 15/0233 |
| | | | 165/80.4 |
| 2005/0217294 A1* | 10/2005 | Insalaco | F25B 23/006 |
| | | | 62/238.2 |
| 2006/0146496 A1* | 7/2006 | Asfia | H05K 7/20672 |
| | | | 361/700 |
| 2007/0193721 A1* | 8/2007 | Tilton | F25B 43/04 |
| | | | 165/104.19 |
| 2007/0273024 A1* | 11/2007 | Madsen | F28D 15/0266 |
| | | | 257/715 |
| 2008/0006037 A1* | 1/2008 | Scott | G06F 1/20 |
| | | | 62/3.6 |
| 2010/0061062 A1* | 3/2010 | Madsen | F28D 15/0266 |
| | | | 361/701 |

* cited by examiner

COOLING DEVICE AND ELECTRONIC EQUIPMENT

CROSS-REFERENCE TO RELATED APPLICATION

This application is based upon and claims the benefit of priority of the prior Japanese Patent Application No. 2013-272813, filed on Dec. 27, 2013 and the prior Japanese Patent Application No. 2014-243454, filed on Dec. 1, 2014, the entire contents of which are incorporated herein by references.

FIELD

The embodiments discussed herein are related to a cooling device and an electronic equipment.

BACKGROUND

An electronic component provided in an electronic equipment generates heat during an operation. Accordingly, various cooling devices cooling the electronic component have been proposed. For example, a boiling cooling device is known in which an evaporating portion container storing a liquid refrigerant and a condenser which condenses a vaporized refrigerant are connected by a single pipeline in which gas and liquid flow in multiphase.

However, the boiling cooling device in the related art utilizes only vaporization energy of a refrigerant, so that a filling ratio of the liquid refrigerant has been lowered in order to make it easy to vaporize the refrigerant. Therefore, when it is intended to secure a necessary cooling capability, the entire cooling device tends to become larger. Further, an exploitation of gravitational force is required in order to cause the refrigerant liquefied by the condenser to return to the evaporator and an arrangement of components is subjected to a positional restriction. Increasing in a size of the cooling device in its entirety or being subjected to positional restriction on the arrangement of components is disadvantageous for mounting the electronic equipments in a high density, so that there are rooms for improvement in a conventional boiling cooling device.

The following is a reference document.
[Document 1] Japanese Laid-Open Patent Publication No. H6-224337.

SUMMARY

According to an aspect of the invention, a cooling device includes: an evaporator that vaporizes a part of a refrigerant by heat generated by an electronic component; a condenser that cools the refrigerant; a refrigerant circulation loop coupled to the evaporator and the condenser, an inside of the refrigerant circulation loop is depressurized; and a pump that circulates the refrigerant, wherein a filling ratio of the liquid refrigerant to a volume of the refrigerant circulation loop is 50% or more.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
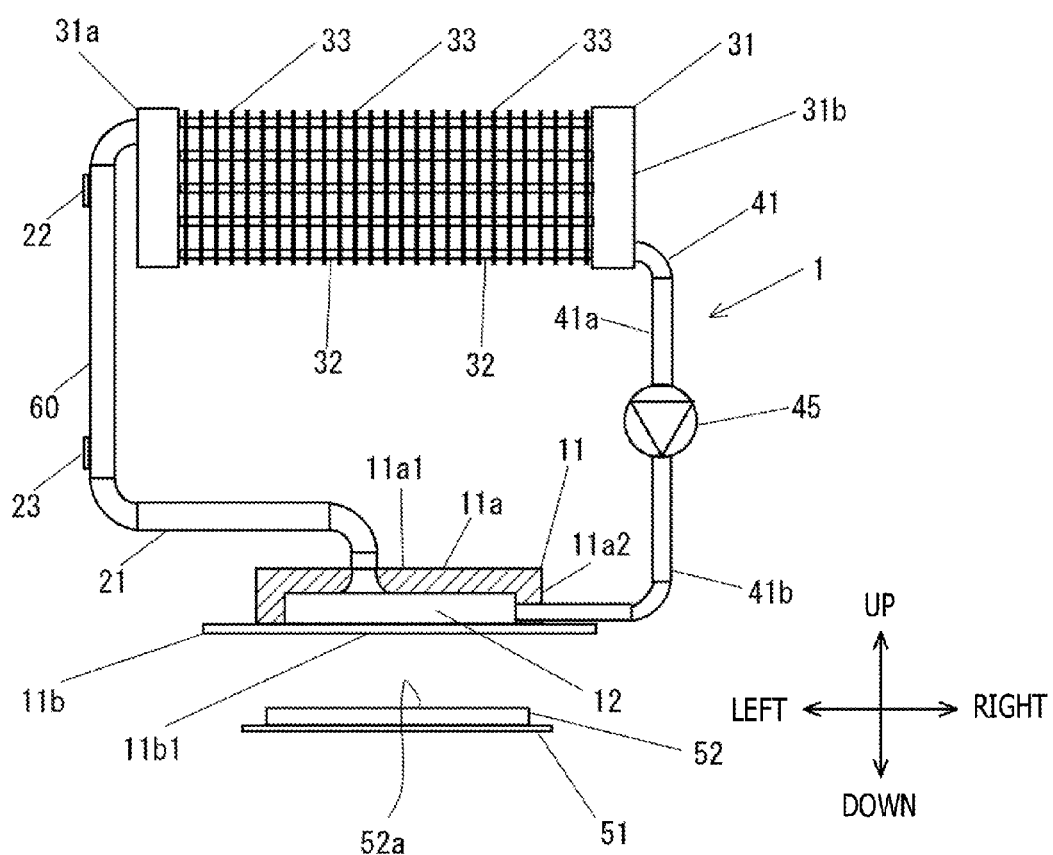
FIG. 1 is an explanatory view diagrammatically illustrating a cooling device and an electronic component according to a first embodiment, the directions "up, down, left, right" are exemplary, and are not restrictive of the invention.

Hereinafter, descriptions will be made on embodiments of the present disclosure in detail with reference to the drawings. But, dimensions or scales of respective constitutional elements may not be fully coincident with actual ones in the drawings. Further, in some of the drawings, the constitutional element which exists actually may be omitted or dimensions thereof may be exaggerated for convenience of explanation. Further, descriptions will be made by using directions represented in FIG. 1 as an up and down and left and right directions in the following description.

First Embodiment

Figure 2:
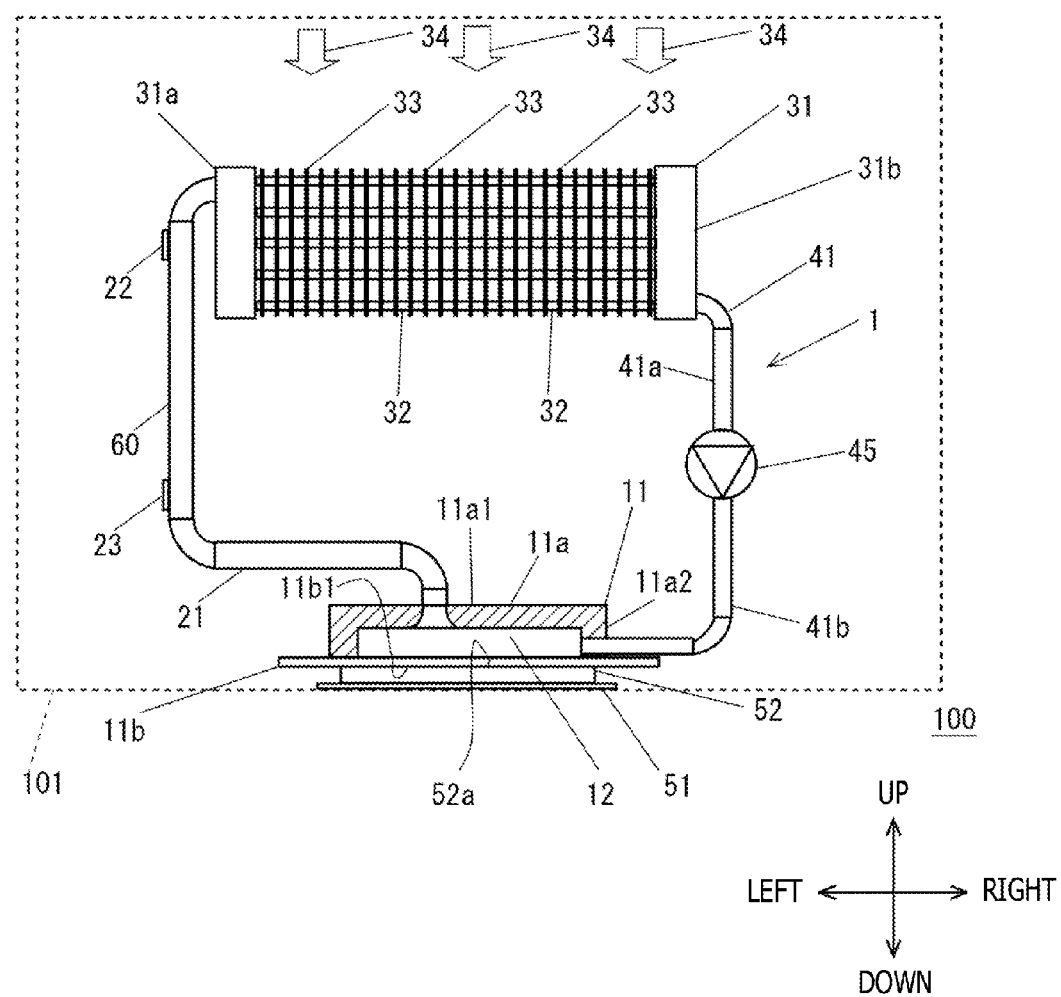
FIG. 2 is an explanatory view diagrammatically illustrating an electronic equipment according to the embodiment, the directions "up, down, left, right" are exemplary, and are not restrictive of the invention.
Figure 3:
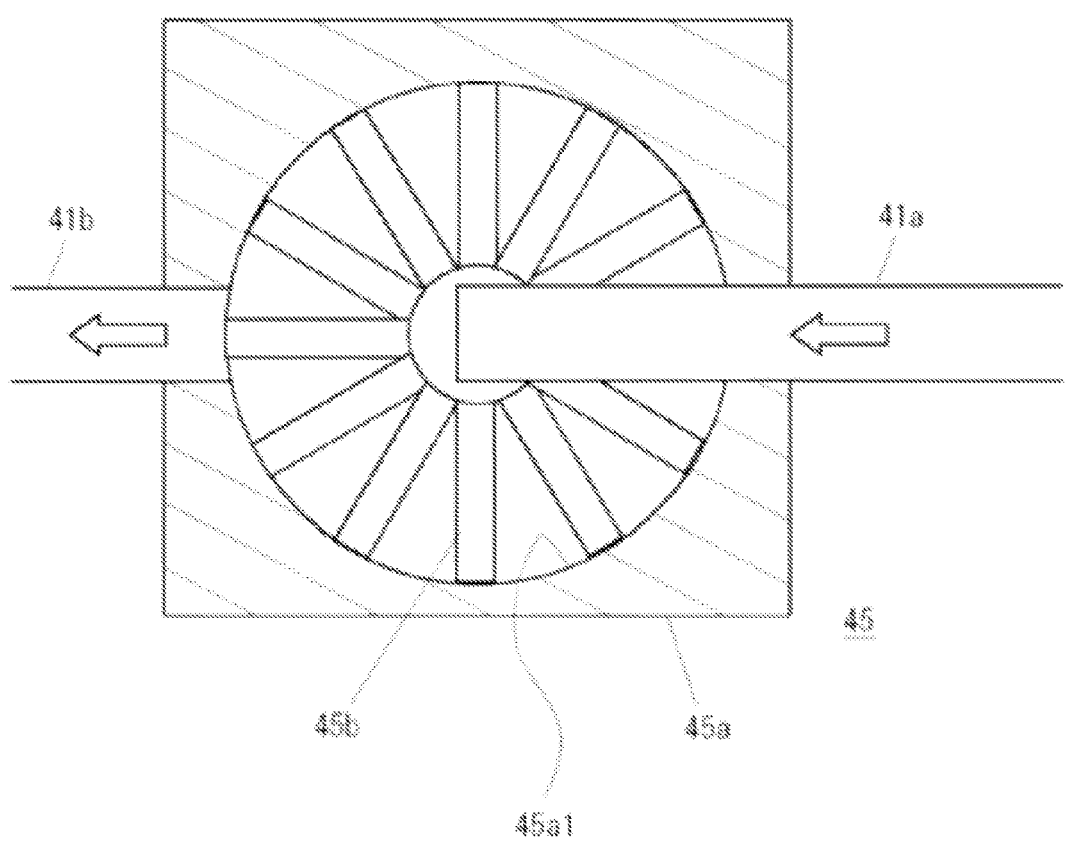
FIG. 3 is an explanatory view diagrammatically illustrating the inside of a pump provided in the cooling device according to the embodiment.

First, a cooling device 1 of the embodiment and a server 100 provided with the cooling device 1 will be described with reference to FIG. 1 to FIG. 3. The server 100 is an example of the electronic equipment. The server 100 includes a substrate 51 disposed in a case 101. A CPU (Central Processing Unit) 52 corresponding to the electronic component is mounted on the substrate 51. The CPU 52 generates heat during the operation and thus is cooled by the cooling device 1. Further, other electronic components than the CPU 52 which needs to be cooled may also be a target to be cooled by the cooling device 1.

The cooling device 1 includes an evaporator 11 which vaporizes a portion of refrigerant R using the heat generated by the CPU 52, a condenser 31 which condenses the refrigerant R and a pump 45 which circulates the refrigerant. The cooling device 1 is provided with a refrigerant circulation loop 60 formed to be capable of depressurizing the inside thereof. In the embodiment, water is used as the refrigerant R, but a known refrigerant capable of being undergone a phase change between a liquid and a gas may be used as well. That is, de-ionized water, liquid mixture of water and alcohol, or alcohol alone may also be used as the substance of refrigerant.

However, the refrigerant R is not limited to these substances. The evaporator 11 and the condenser 31 are connected with each other by a first piping 21 in which the refrigerant R warmed by the evaporator 11 flows and a second piping 41 in which the refrigerant R cooled by the condenser 31 flows. The pump 45 is installed at the second piping 41. Further, in the following description, a portion of the second piping 41 located between the condenser 31 and the pump 45 is called an the upstream portion 41a, and a portion of the second piping 41 located between the pump 45 and the evaporator 11 is called a downstream portion 41b.

The pump 45 may be operated in a watertight state and thus, installed at a downstream side of the condenser 31.

The evaporator 11 includes a housing 11a and a heat transfer plate 11b. A space serving as a refrigerant containing portion 12 is formed inside of the evaporator 11. The housing 11a includes an upper plate 11a1 and a side wall 11a2. One end portion of the first piping 21 is connected to the upper plate 11a1. The one end portion of the first piping 21 connected to the upper plate 11a1 is formed in a shape of a trumpet having an opening with a larger aperture so as to allow the refrigerant R within the refrigerant containing portion 12 to be easily flown into the first piping 21. The first piping 21 extends from the evaporator 11 toward an upper side. The first piping 21 has been extended toward the upper side, such that the refrigerant R vaporized by the evaporator 11 is easily flown into the first piping 2. The second piping 41, more specifically, one end portion of the downstream portion 41b of the second piping 41 is connected to the side wall 11a2 of the housing 11a. The second piping 41 is connected to a location positioned as low as possible of the side wall 11a2, that is, a location close to the heat transfer plate 11b.

Accordingly, the refrigerant R cooled by the condenser 31 may be supplied to a location in the vicinity of the heat transfer plate 11b. A bottom surface 11b1 of the heat transfer plate 11b corresponds to a surface closely adhering to the top surface 52a of the CPU 52. The evaporator 11 vaporizes a portion of the refrigerant R. That is, there is no such case where the refrigerant R filled within the refrigerant circulation loop 60 is entirely vaporized. As described above, when the portion of the refrigerant R is vaporized, a cooling effect caused by the vaporization energy of the refrigerant R and a cooling effect due to the increase of temperature of the liquid refrigerant R may be obtained. A filling ratio of the liquid refrigerant to a volume of the refrigerant circulation loop 60 will be described in detail later.

The condenser 31 includes an upstream side tank 31a and a downstream side tank 31b. Also, a plurality of refrigerant circulation pipes 32 are arranged and provided between the upstream side tank 31a and the downstream side tank 31b. In the condenser 31, a plurality of cooing fins 33 are provided to intersect with a plurality of refrigerant circulation pipes 32. The wind flowing in a direction indicated by an arrow 34 passes through a space between the cooing fins 33 so that the refrigerant R flowing in the refrigerant circulation pipe 32 is cooled. The plurality of refrigerant circulation pipes 32 is disposed in a layered shape in a vertical direction. The flow of the refrigerant R is turned over to be flown in an opposite direction at the upstream side tank 31a and the downstream side tank 31b, so that the refrigerant R flows in a left and right direction alternately within the refrigerant circulation pipe 32 disposed in a layered shape.

As described above, the flow of the refrigerant R is turned over to be flown in an opposite direction so that the length of a flow passage of the refrigerant R becomes longer. As a result, a heat exchange time becomes longer and thus, the cooling effect by the refrigerant R may be increased. The condenser 31 cools down the refrigerant R. When the vaporized refrigerant R is cooled down, the refrigerant R becomes a liquid state and when the liquid refrigerant R is cooled down, the temperature decreases.

The other end of the first piping 21 is connected to an upper part of the condenser 31. More specifically, the other end of the first piping 21 is connected to an upper part of the upstream side tank 31a of the condenser 31. In the meantime, the second piping 41, more specifically, one end of an upstream portion 41a of the second piping 41 is connected to a lower part of the downstream side tank 31b of the condenser 31. A connection positional relationship of the first piping 21 and the second piping 41 with respect to the condenser 31 is set as described above and thus, the liquid refrigerant R may be discharged from the downstream side tank 31b which serves as an outlet port of the condenser 31. The pump 45 is disposed at the second piping 41. When gas passes through the pump 45, the operation of the pump 45 becomes unstable so that it is intended to avoid gas from flowing into the pump 45.

As in the embodiment, the first piping 21 and the second piping 41 may be connected to the condenser 31 to avoid an occasion where the gas flows into the pump 4. Further, a gas collection unit may be formed at an upper part of the condenser 31, for example, an upper part of the upstream side tank 31a or the downstream side tank 31b which serves as a flow turning-over unit of the refrigerant R so as to capture the refrigerant R which is unable to be liquefied entirely or the mixed in air. Accordingly, it is possible to more surely avoid an occasion where the gas flows into the pump 45.

A liquid-contacting part of the refrigerant circulation loop 60 may be molded by a metallic material, and is also molded by a metallic material in the present embodiment. This is because it is intended to suppress air from soaking into the refrigerant circulation loop 60 from outside when the inside of the refrigerant circulation loop 60 is depressurized to be near to a vacuum state. When the refrigerant circulation loop 60 is depressurized in a state where the liquid-contacting part made of a resin or rubber which is inferior to a metal in air-tightness is used, a possibility that air infiltrates into the inside of the refrigerant circulation loop 60 increases. When the outside air infiltrates into the refrigerant circulation loop 60, an internal pressure thereof increases.

Accordingly, the boiling point of the refrigerant R increases and the temperature of the CPU 52 increases. When this symptom progresses, there is a possibility that the guaranteed operating temperature of the CPU 52 may be exceeded shortly. Therefore, in the cooling device 1 of the present embodiment, the liquid-contacting part of the refrigerant circulation loop 60, that is, the liquid-contacting parts of the evaporator 11, the first piping 21, the condenser 31, the second piping 41 and the pump 45 are made of metallic material. Here, the liquid-contacting part refers to a part to which the refrigerant R may flow and contact.

Accordingly, in the evaporator 11, the housing 11a which stores the refrigerant R and the heat transfer plate 11b are made of metallic material. Further, the first piping 21 and the second piping 41 are molded by metallic material. In the condenser 31, the upstream side tank 31a, the downstream side tank 31b and the refrigerant circulation pipe 32 are molded by metallic material. The liquid-contacting part includes inner portion of the pump 45. Referring to FIG. 3, the pump 45 includes a casing 45a in which a rotary fin accommodation unit 45a1 is formed. Accordingly, the casing 45a is molded by the metallic material in the pump 45 of the embodiment. Further, since a rotary fin 45b itself is accommodated in the sealed casing 45a and does not affect water tightness and/or air tightness, the rotary fin 45b is made of resin. Further, metallic material such as a stainless steel or a copper may be appropriately selected.

In the meantime, when the liquid-contacting part of the refrigerant circulation loop 60 as described above is molded by a metallic material, the price of constitutional components such as the evaporator 11, the first piping 21, the condenser 31, the second piping 41 and the pump 45 becomes higher and the weight thereof becomes larger. Further, when these components are intended to be molded by the metallic material, only brazing or soldering is allowed as a method of forming an assembly and thus a processing cost becomes higher. Therefore, a rubber or resin may be partially utilized for the first piping 21, the second piping 41 and the pump 45 in order to achieve, for example, a cost reduction or weight reduction. Further, when the rubber or resin is partially utilized as described above, it is conceivable that water tightness or air tightness is deteriorated. The structure of the cooling device capable of maintaining cooling function by suppressing the deterioration of water tightness or air tightness will be described in the section for Second Embodiment.

Next, a depressurization processing which makes the inside of the refrigerant circulation loop 60 near to a vacuum state will be described with reference to FIG. 4. First, the reason the depressurization processing is performed will be described. When the refrigerant R is filled into the refrigerant circulation loop under the atmospheric pressure condition without depressurizing the refrigerant circulation loop, the boiling point of the refrigerant R increases and thus, the CPU 52 may not be sufficiently cooled down. For example, it is considered that in the cooling device 1 of the embodiment in which water is used as the refrigerant, the boiling point of the refrigerant R is 100° C. under the atmospheric pressure and the temperature of the CPU 52 may actually exceeds 110° C., which may affect the operation of the server 100. Accordingly, the depressurization processing is performed to decrease the boiling point thereby making it easy to obtain the cooling effect by the vaporization energy.

Figure 4A:
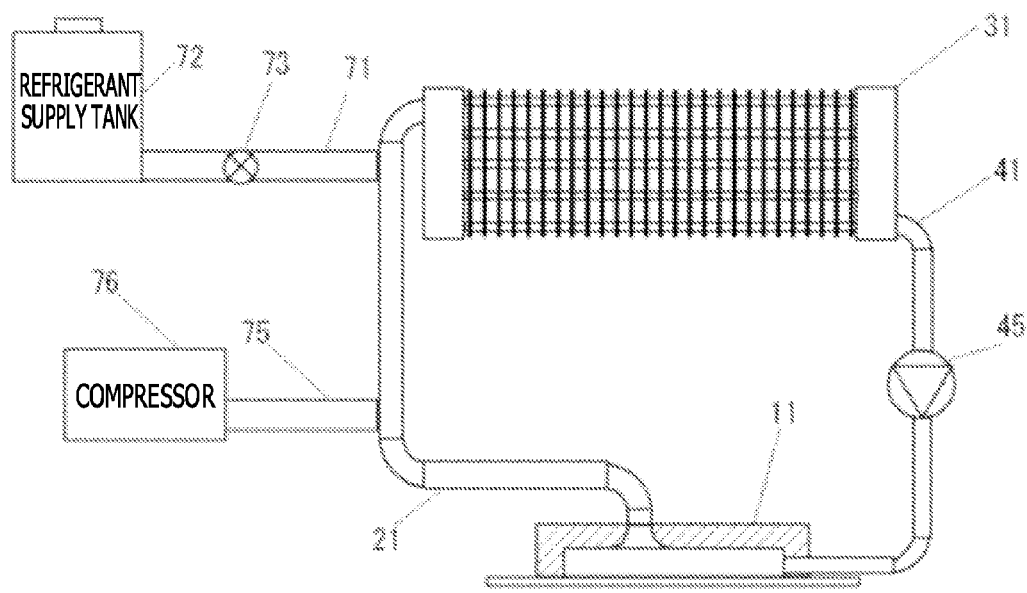
FIG. 4A and FIG. 4B are explanatory views diagrammatically illustrating an example of a method of filling a refrigerant into the cooling device.

As illustrated in FIG. 4A, the depressurization processing is performed using a refrigerant supply pipe 71 and a depressurization pipe 75 that are connected to the first piping 21. The refrigerant supply tank 72 is attached to the refrigerant supply pipe 71. Further, a refrigerant supply valve 73 which may block the supply of the refrigerant R from the refrigerant supply tank 72 is provided on the refrigerant supply pipe 71. A compressor 76 which makes the inside of the refrigerant circulation loop to be the vacuum state is connected to the depressurization pipe 75. Further, both the refrigerant supply pipe 71 and the depressurization pipe 75 are made of metallic material.

Figure 4B:
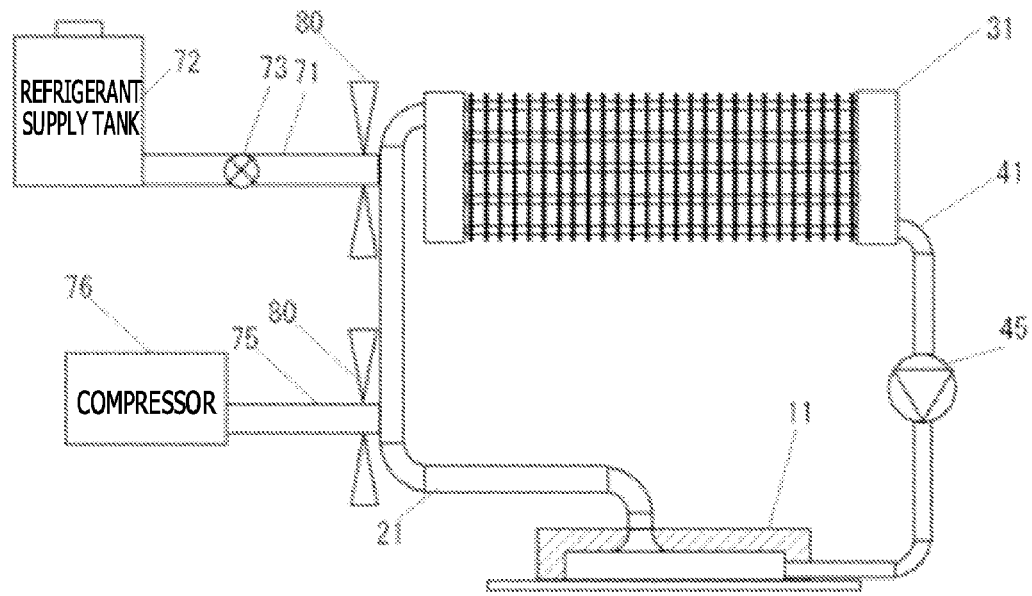

First, the refrigerant circulation loop 60 is depressurized by the compressor 76 in a state where the refrigerant supply valve 73 is closed. Then, the refrigerant supply valve 73 is open. By doing these operations, the refrigerant R is flown from inside of the refrigerant supply tank 72 into the refrigerant circulation loop 60. When the refrigerant R is filled into and reaches a desired filling ratio, the refrigerant supply valve 73 is closed. Thereafter, as illustrated in FIG. 4B, using a sealing tool 80, the refrigerant supply pipe 71 and the depressurization pipe 75 are cut, the cut parts are flattened and a first sealing part 22 and a second sealing part 23 are formed on the cut parts, respectively. Accordingly, the inside of the refrigerant circulation loop 60 is filled with the refrigerant R and is sealed. A certain finishing operation may be performed on the first sealing part 22 and the second sealing part 23 by, for example, applying solder on the surfaces thereof. Further, a state of the refrigerant supply valve 73 or a manipulation sequence of the sealing tool 80 may be appropriately changed.

Here, the filling ratio of the refrigerant R will be described. The filling ratio of the refrigerant R is evaluated by the amount (volume) of the liquid refrigerant with respect to the volume of the refrigerant circulation loop 60. The volume of the refrigerant circulation loop 60 includes the volume of the entire space which is in communication with the passage of the refrigerant R. Accordingly, the volume of the entire region which is depressurized by a depressurization processing becomes a target volume of the refrigerant circulation loop 60.

Figure 5:
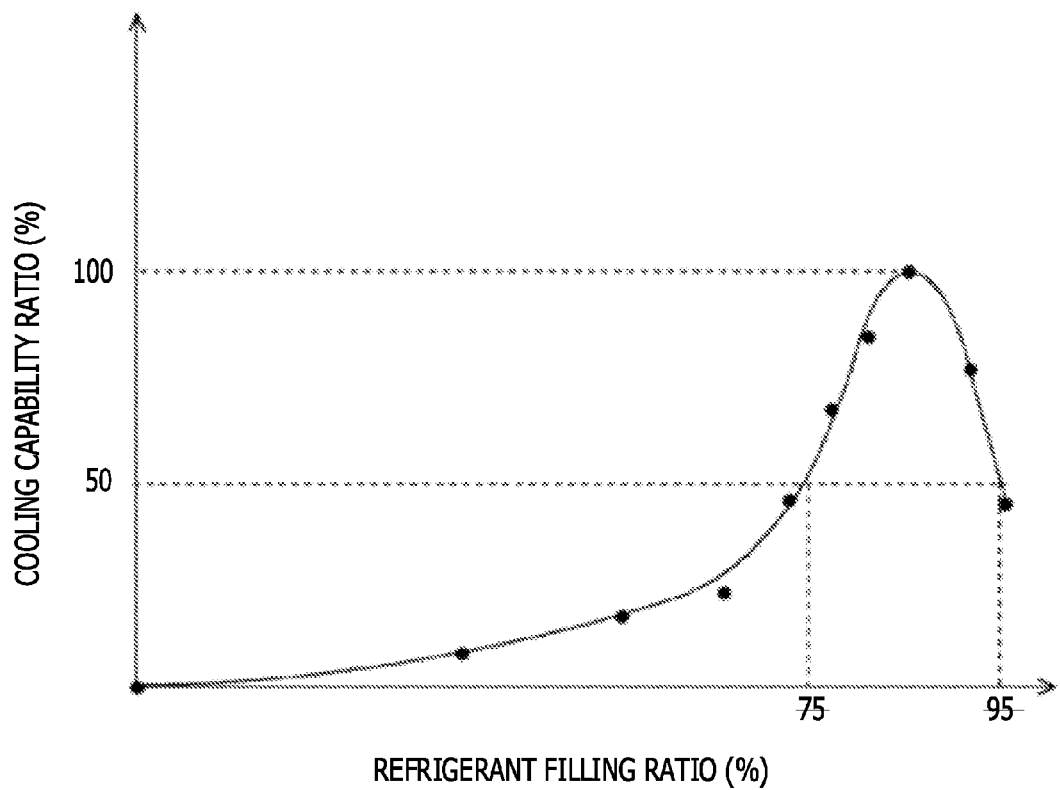
FIG. 5 is a graph illustrating a relationship between a refrigerant filling ratio and a cooling capability ratio.

The filling ratio of the refrigerant R may be set to 50% or more. Specifically, the filling ratio of the cooling device 1 of the embodiment is set to 60%. Referring to FIG. 5 where the horizontal axis indicates a refrigerant filling ratio (%) and the vertical axis indicates a refrigerant capability ratio (%), the filling ratio by which the maximum cooling capability may be obtained is 85%. The filling ratio by which the maximum cooling capability may be obtained is obtained by repeatedly evaluating the cooling capability while changing the filling ratio. In a case where the maximum cooling capability (unit: W) obtained when the filling ratio is set to 85% is 100%, a ratio of cooling capability (%) for a certain filling ratio with respect to the maximum cooling capability is defined as a cooling capability ratio. Referring to FIG. 5, a graph is illustrated in which the horizontal axis indicates a refrigerant filling ratio (%) and the vertical axis indicates a refrigerant capability ratio (%).

When the filling ratio of the refrigerant is increased from 0 (zero) and a state is build where the liquid refrigerant may exist within the refrigerant circulation loop 60, the refrigerant R is evaporated by the heat of the CPU 52 in the evaporator 11, and becomes a gaseous state to reach the condenser 31. The gaseous refrigerant R which has reached the condenser 31 is condensed in the condenser 31 and supplied to the evaporator 11 again. However, when the filling ratio of the refrigerant R is low, a total amount of the vaporization energy is small and the cooling capability is low even though the entire refrigerant R is vaporized.

Referring to FIG. 5, it may be found out that when the filling ratio increases, the cooling capability also increases. When the filling ratio reaches 50%, the cooling capability ratio reaches a degree which is little below 10% of the maximum cooling capability (a filling ratio of 85% corresponds to a cooling capability of 100%). Also, when the filling ratio becomes close to 60%, the cooling capability also increases abruptly. It is considered that in the vicinity of the filling ratio of 60%, the entire amount of the refrigerant R is not vaporized and a portion of the refrigerant R may still exist in the liquid state within the refrigerant circulation loop 60.

As described above, the cooling effect by the energy due to the rising of the temperature of the liquid refrigerant R is added to the cooling effect caused by the vaporization energy, so that the cooling capability increases in a two-phase flow state where a portion of the refrigerant R is vaporized and the remaining portion is circulated in a state of being liquid. As described above, the filling ratio in the present embodiment is set to 60% at which the cooling capability increases abruptly. When the filling ratio reaches 75%, the cooling capability ratio (%) reaches about one half of the maximum cooling capability. When the filling ratio reaches 85%, a cooling capability reaches the maximum cooling capability.

When the filling ratio of the refrigerant R is further increased from 85%, an increasing trend of the cooling capability is changed and the cooling effect begins to decrease. It is considered that this is because when the filling efficiency is made higher than 85%, the volume of the space in which vapor resulting from evaporation of the refrigerant R may exist decreases and the vapor pressure of the space also increases. That is, it is considered that the boiling point begins to rise and the cooling capability begins to decrease as the vapor pressure of the space increases. When the filling ratio is further increased to exceed 95%, the refrigerant R is hardly boiled and only the liquid refrigerant contributes to the cooling. Therefore, the cooling capability is reduced.

Referring to FIG. 5, the maximum cooling capability is exhibited when the filling ratio is 85%, and the cooling capability decreases when the filling ratio is larger than or less than 85%. However, when the filling ratio is 50% or more, a constant cooling capability may be secured. As described above, when the filling ratio comes near 60%, the cooling capability abruptly increases due to the two-phase flow of gas and liquid. When the filling ratio is 75% or more, a high cooling capability is secured by the cooling effect of the vaporization energy and the cooling effect caused by the increase of the temperature of the liquid refrigerant.

In the meantime, even when the filling ratio is higher than 85% but less than or equal to 95%, the same cooling capability as that obtained when the filling ratio is 75% may be obtained. As described above, when the filling ratio of the liquid refrigerant "R" (which is in a range) between 75% and 95% is adopted, the cooling performance may be improved efficiently.

Subsequently, descriptions will be made on a cooled state of the CPU 52 by the cooling device 1 of the present embodiment. The heat generated by the CPU 52 which is being used is transferred to the refrigerant R within the evaporator 11 through the heat transfer plate 11b. By doing so, the temperature of a portion of the refrigerant R filled within the refrigerant circulation loop 60 increases in a liquid state as it is. The refrigerant R in a liquid state is pressurized and fed by the pump 45 to be circulated. The refrigerant R which has reached the condenser 31 through the first piping 21 releases heat at the condenser 31, and then is supplied again to the evaporator 11 through the second piping 41 in a state where the temperature is decreased. In this case, in a state where the extent of heat generation by the CPU 52 may be cooled down and cancelled by the liquid refrigerant R, the cooling device 1 may stably circulate the liquid.

When the amount of heat generation by the CPU 52 becomes larger compared to a state where the stable liquid circulation may be maintained, the temperature of the liquid refrigerant R further increases. Also, when the temperature reaches the boiling point of the refrigerant R, the refrigerant R begins to boil to become a state where the liquid is deprived of its heat due to a phase change that the liquid is vaporized. The vaporized refrigerant R reaches the condenser 31 through the first piping 21 in a state of being mixed with the liquid refrigerant R. The vaporized refrigerant R is cooled down to release the heat at the condenser 31 and returns to a liquid again. Even after having been returned to the liquid, the temperature of the refrigerant R is further decreased during the refrigerant R passes through the refrigerant circulation pipe 32 and is supplied to the evaporator 11 through the second piping 41.

As described above, it is possible to obtain a high cooling capability and achieve downsizing, weight reduction, and/or cost reduction due to the cooling effect caused by the vaporization energy and the cooling effect caused by increasing the temperature of the liquid refrigerant according to the cooling device 1 of the embodiment. Further, by using the pump, the restriction on the positional relationship between the condenser and the evaporator is removed, and thus, the degree of freedom in the arrangement of components increases.

Second Embodiment

Figure 6:
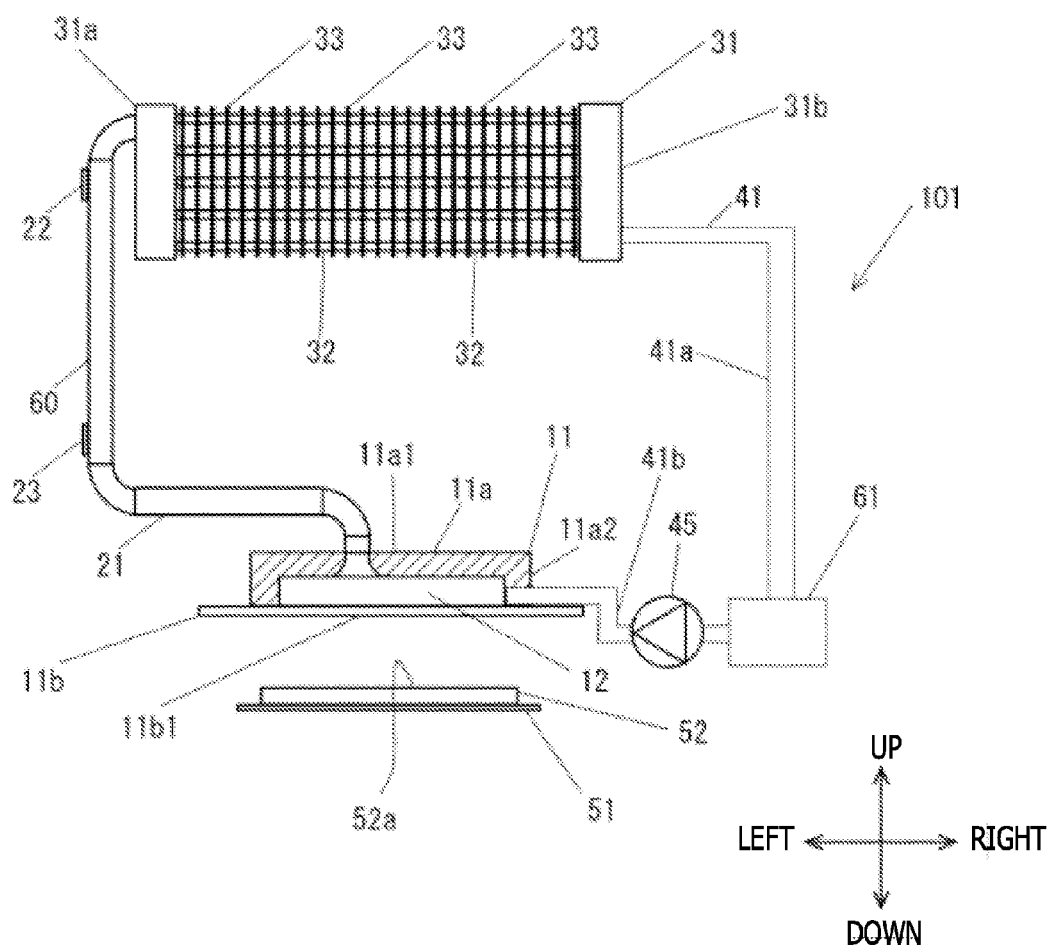
FIG. 6 is an explanatory view diagrammatically illustrating a cooling device and an electronic component according to a second embodiment.

In the cooling device 1 of the first embodiment, the cooling capability may be efficiently improved by adopting the filling ratio of the liquid refrigerant "R" between 75% and 95%. Here, referring to FIG. 5, in an area where the filling rate is between 50% and 75%, a relative ratio of the cooling capability becomes more than 9% but less than 50% of the maximum capability. However, the absolute value (unit: W) of the cooling capability becomes possible to reach the cooling capability value which corresponds to the filling rate having a range between 75% and 95% before extension of the volume by adopting measures to extend the volume of refrigerant loop. Therefore, a cooling device 101 of the second embodiment is equipped with a built-in tank 61 in the refrigerant circulation loop 60 as illustrated in FIG. 6. Specifically, the tank 61 and the pump 45 are disposed at the lowest position on the refrigerant circulation loop 60.

The cooling device 101 may include the tank 61 to extend the volume of the refrigerant circulation loop 60. Accordingly, the pump is always filled with the refrigerant also at the area where the filling rate is between 50% and 75% and thus the cooling capability is stably maintained without allowing gas to enter and mix with the refrigerant in the pump. For example, when the volume of the cooling device for which the filling rate of refrigerant R is set to 60% (e.g., cooling capability ratio is about 30%) is doubled, the absolute value of the cooling capability may exceed the capability value of the cooling device having the filling rate of 75% before the extension of the volume.

As described above, even when the filling rate of the refrigerant R is decreased, it is possible to maintain the absolute value of the cooling capability at a high level by extending the volume of the refrigerant circulation loop 60. However, when the filling rate of the refrigerant R is decreased, the refrigerant leaked from the condenser 31 may easily become a mixture of liquid and gas. For example, while even the cooling device 1 of the first embodiment illustrated in FIG. 1 may maintain the cooling capability at a constant level, the cooling capability may decrease when the gas is introduced into the pump.

As described in the First Embodiment section, rubber material or resin material may be partially utilized in the cooling device in order to reduce, for example, the cost or weight. A rubber or resin material is inferior to metal material in terms of the air tightness or water tightness. Therefore, when the cooling device is used for a long time, the refrigerant R within the refrigerant circulation loop 60 is leached outside and thus the amount of refrigerant R decreases. Further, the outside air infiltrates into the refrigerant circulation loop 60 and circulates inside the refrigerant circulation loop 60 as the gas unable to be changed to the liquid. As a result, it is considered that the cooling device becomes a state where the gas is easily mixed with the refrigerant within the pump 45. Therefore, similarly to the cooling device 101 of the second embodiment illustrated in FIG. 6, the tank 61 is installed in a position between the pump 45 and condenser 31 which corresponds to the lowest place on the refrigerant circulation loop 60.

Accordingly, for example, even though the filling rate of the refrigerant is decreased to the filling rate of 50%, the liquid refrigerant R is aggregated in the pump 45 installed in a low position and thus, it is able to avoid an occasion where gas is introduced into the pump and the pump may maintain the refrigerant circulation capability. Further, when the rubber or resin material is utilized, there is a concern over shortening of lifetime caused by leaching of the refrigerant compared to a case where a metal material is utilized. However, since a total amount of refrigerants increases due to the installation of the tank 61, the lifetime of the cooling device 101 may be extended.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A cooling device comprising:
   a refrigerant circulation loop that a refrigerant flows in a circle through an inside thereof, the refrigerant circulation loop includes,
   an evaporator that vaporizes a part of the refrigerant by heat generated by an electronic component,
   a condenser that cools the refrigerant, and
   a pump that circulates the refrigerant and has a moving fin,
   wherein a filling ratio of the liquid refrigerant to a volume of the refrigerant circulation loop is from 75% to 95%, and a cooling capability ratio is 50% or more.

2. The cooling device according to claim 1, wherein the inside of the refrigerant circulation loop is filled with the refrigerant and is sealed by metal.

3. The cooling device according to claim 1, further comprising:
   a first piping in which the refrigerant warmed by the evaporator flows; and
   a second piping in which the refrigerant cooled by the condenser flows,
   wherein the evaporator is coupled with the condenser by the first piping and the second piping.

4. The cooling device according to claim 3, wherein the first piping is coupled to an upper part of the condenser and the second piping is coupled to a lower part of the condenser.

5. The cooling device according to claim 1, wherein a liquid-contacting part, which the refrigerant flows and contact, of the refrigerant circulation loop is molded by a metallic material.

6. The cooling device according to claim 1, wherein the inside of the refrigerant circulation loop is depressurized to less than atmospheric pressure.

7. The cooling device according to claim 1, further comprising;
   a tank that extends the volume of the refrigerant circulation loop in the refrigerant circulation loop.

8. The cooling device according to claim 1, wherein the moving fin is a rotary fin.

9. A cooling device comprising:
   a refrigerant circulation loop that a refrigerant flows in a circle through an inside thereof, the refrigerant circulation loop includes,
   an evaporator that vaporizes a part of the refrigerant by heat generated by an electronic component,
   a condenser that cools the refrigerant,
   a pump that circulates the refrigerant,
   a first piping in which the refrigerant warmed by the evaporator flows, and
   a second piping in which the refrigerant cooled by the condenser flows,
   wherein a filling ratio of the liquid refrigerant to a volume of the refrigerant circulation loop is from 75% to 95%, and a cooling capability ratio is 50% or more,
   wherein the evaporator is coupled with the condenser by the first piping, and
   wherein the pump is directly coupled with the condenser and the evaporator via the second piping.

* * * * *